United States Patent [19]
Kliman et al.

[11] Patent Number: 6,121,788
[45] Date of Patent: Sep. 19, 2000

[54] METHOD AND FIXTURE FOR EVALUATING STATOR CORE QUALITY IN PRODUCTION

[75] Inventors: Gerald Burt Kliman, Niskayuna, N.Y.; Albert Andreas Maria Esser, Delafield, Wis.

[73] Assignee: General Electric Company, Schenectady, N.Y.

[21] Appl. No.: 09/133,357

[22] Filed: Aug. 13, 1998

[51] Int. Cl.$^7$ .................................................. G01R 31/06
[52] U.S. Cl. .......................... 324/772; 310/273; 310/216; 164/109; 318/246; 340/319
[58] Field of Search ..................... 324/772, 546, 324/158.1, 545; 310/273, 216; 164/109; 318/246; 340/319

[56] References Cited

U.S. PATENT DOCUMENTS

| | | | |
|---|---|---|---|
| 3,834,013 | 9/1974 | Gerstle ..................................... | 310/216 |
| 4,088,177 | 5/1978 | Armstrong et al. ...................... | 164/109 |
| 4,215,464 | 8/1980 | Miller ....................................... | 310/273 |
| 5,457,402 | 10/1995 | Sato ......................................... | 324/772 |
| 5,907,244 | 5/1999 | Crabill et al. ............................ | 324/546 |

FOREIGN PATENT DOCUMENTS 2044936A  10/1980  United Kingdom ........... G01R 31/02

OTHER PUBLICATIONS

Hamer, P.S., "Acceptance Testing Of Electric Motors and Generators", IEEE Transactions On Industry Applications, US, IEEE Inc. New York, vol. 24, No. 6, p. 1138–1152. ISSN: 0093–9994.

*Primary Examiner*—Safet Metjahic
*Assistant Examiner*—Jim Nguyen
*Attorney, Agent, or Firm*—Marvin Snyder; Douglas E. Stoner

[57] ABSTRACT

A fixture to evaluate stator production quality is placed about a stator core so as to introduce a test winding about the stator without need for hand winding. The fixture includes an inner annulus and an outer annulus each with axial conductors thereon, and top and bottom plates each with conductors thereon. The core is fitted between the inner and outer annuli, and between the top and bottom plates. The inner axial conductors and outer axial conductors are connected to one another at their lower ends through the bottom plate conductors and at their upper ends through the top plate conductors. Once testing is complete, the fixture is easily removed.

10 Claims, 3 Drawing Sheets

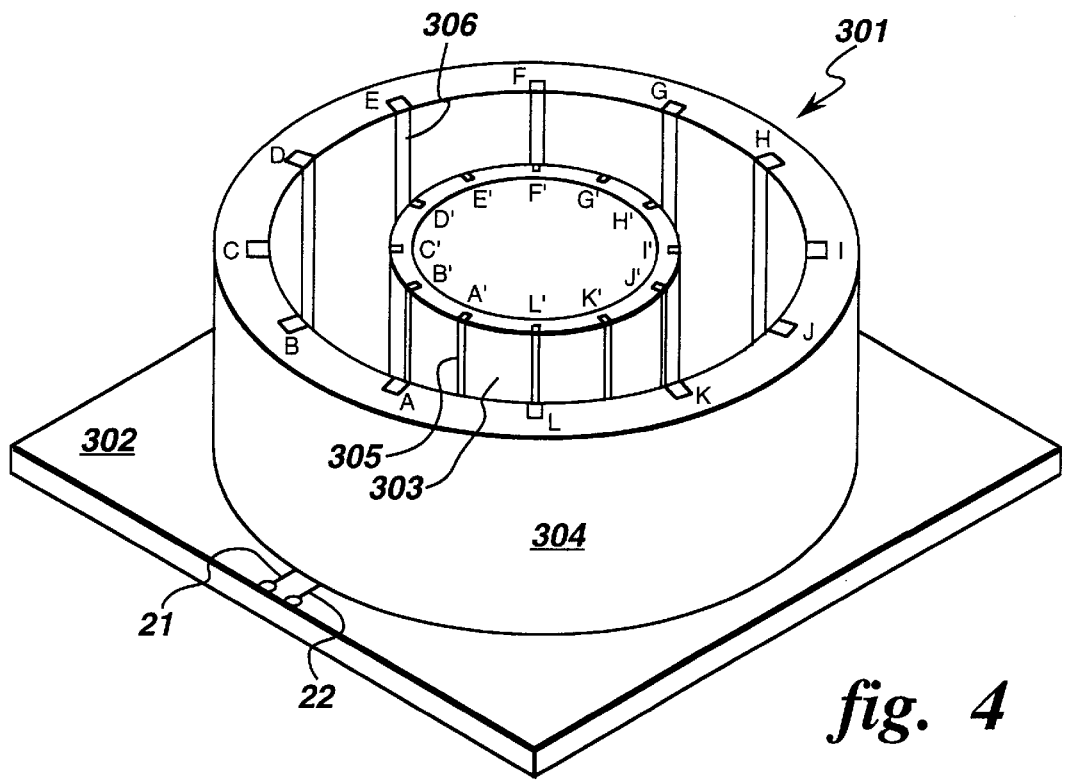
fig. 4
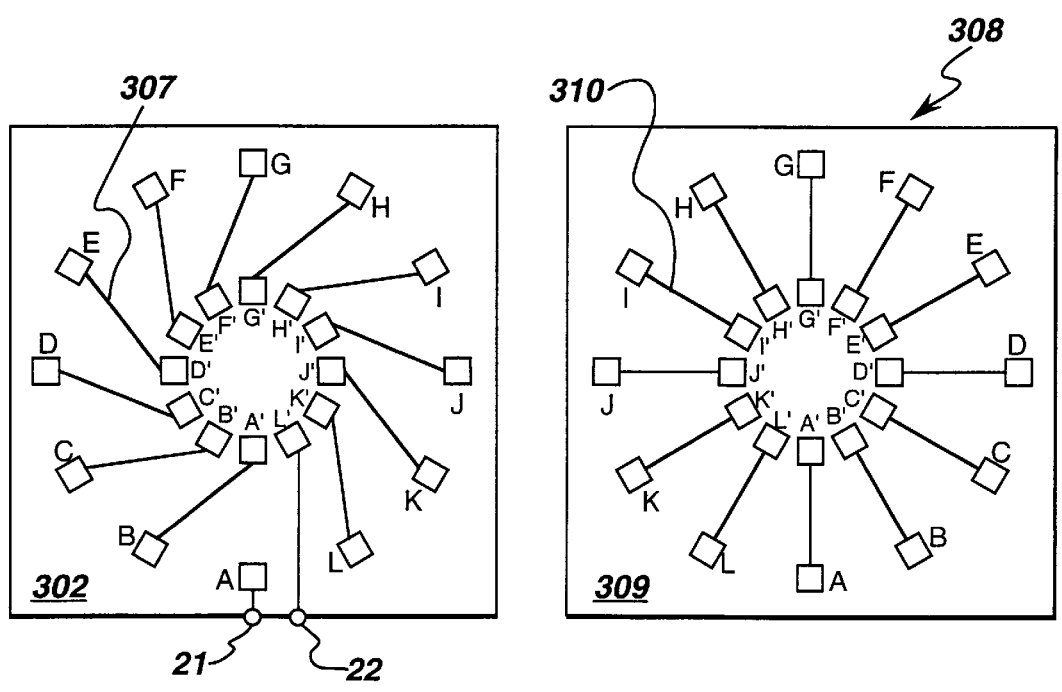
fig. 5
fig. 6

METHOD AND FIXTURE FOR EVALUATING STATOR CORE QUALITY IN PRODUCTION

FIELD OF THE INVENTION

This invention relates generally to the field of stator core production, and more particularly to quality testing of stator cores during production.

BACKGROUND OF THE INVENTION

In the manufacture of high efficiency motors and precision resolvers, for example, it is necessary to be able to evaluate the effects of processing steps on the quality of the magnetic core material in a timely and cost efficient manner. Heretofore, this issue has been addressed by winding a multiturn coil, laboriously by hand, through the bore and around the yoke of the magnetic circuit to provide the capability to excite and evaluate the state of the material.

It is therefore desirable to provide a fixture for quickly placing a multiturn coil, having a precisely fixed and repeatable geometry, around the yoke of a typical magnetic machine in order to make measurements of and trend magnetic properties. It is also desirable to be able to remove this fixture quickly without damaging or stressing the core.

SUMMARY OF THE INVENTION

A two part fixture, with conductors embedded, is mated on a motor core to complete a multiturn winding in order to evaluate core permeability and losses. The fixture includes an inner annulus with a plurality of inner axial conductors thereon, an outer annulus with a plurality of outer axial conductors thereon, a bottom plate with a plurality of bottom plate conductors thereon, and a top plate with a plurality of top plate conductors thereon. The inner conductors and outer conductors are electrically connected to one another at lower ends thereof through the bottom plate conductors and at upper ends thereof through the top plate conductors, so as to form a complete, continuous electrical winding.

BRIEF DESCRIPTION OF THE DRAWING

FIG. 4 is a perspective view of a representative stator core quality evaluation fixture in accordance with the invention.

FIG. 5 is a top plan view of a set of representative electrical connections for a bottom plate of the fixture shown in FIG. 4.

FIG. 6 is a bottom (upside down) plan view of a set of representative electrical connections for a top plate that is attached to the top portion of the fixture shown in FIG. 4, to complete the electrical connections of that fixture.

DETAILED DESCRIPTION OF THE INVENTION

Figure 1:
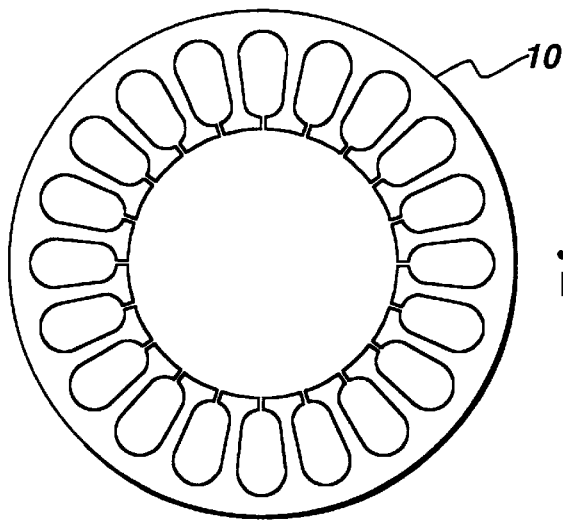
FIG. 1 is a plan view of a conventional stator core lamination.
Figure 2:
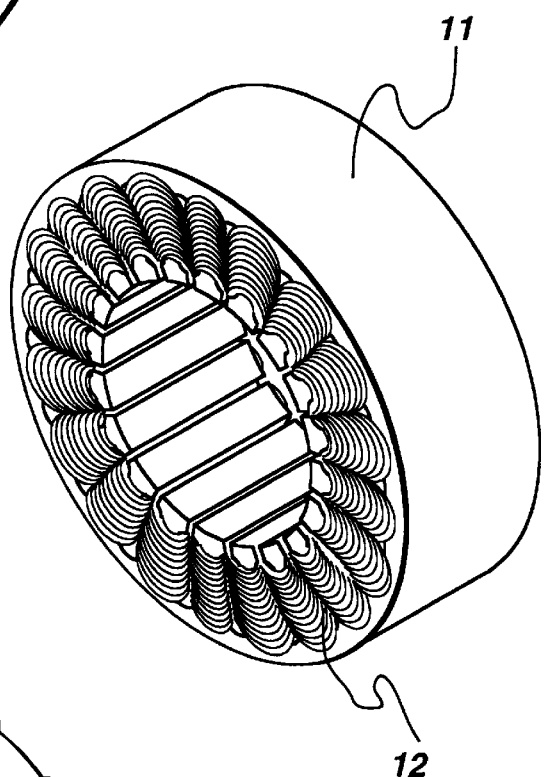
FIG. 2 is a perspective view of a conventional stator core assembled by stacking a large number of the laminations shown in FIG. 1 and inserting wire.

FIG. 1 illustrates a lamination 10 typical of electromechanical energy converters and transducers such as precision resolvers. As shown in FIG. 2, core 11 of the device is formed by stacking a large number of laminations 10 in registration, and inserting wires 12 into the slots. The efficiency of energy converters and the accuracy and precision of transducers depends on maintaining the quality of the core magnetic material. The quality is manifest in the principal properties of the core, which are the permeability and the specific losses. These properties are severely affected by mechanical stresses, coating integrity, contaminants, bonding or impregnating compounds, dull tools, and other quality-compromising factors commonly encountered in manufacturing processes.

Figure 3:
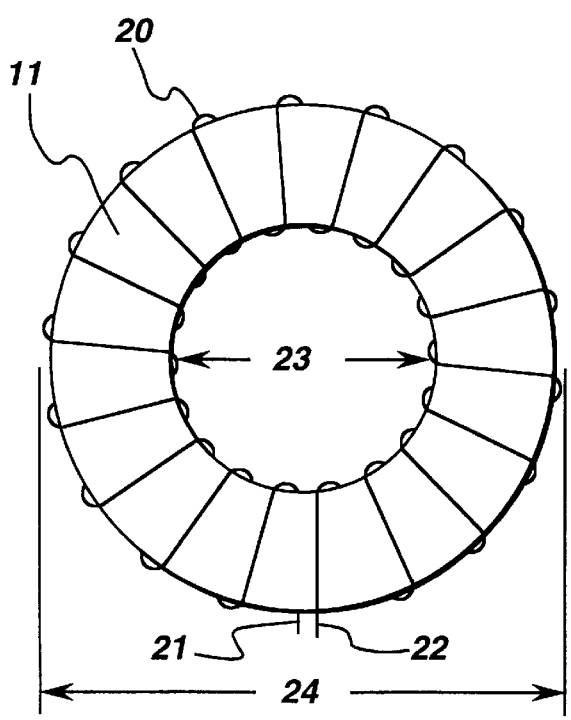
FIG. 3 is a front schematic view of a typical (prior art) toroidal winding about a stator core, used to test production quality of the core.

FIG. 3 illustrates the usual (prior art) method of checking these properties of an assembled magnetic core, such as that shown in FIG. 2, which is to wind a toroidal coil with testing leads 21 and 22 around core (yoke) 11 to create a winding 20. Although automatic winding machines are available for winding multiturn inductors of this general form with large numbers of turns, they are inappropriate for test windings of this nature because they are expensive and difficult to use, and introduce more defects. Consequently, windings are laboriously wound by hand with hookup wire. In addition, windings must be removed when testing is complete, which adds more time and labor. Naturally the windings do not always go on in exactly the same configuration, and so the test results from one stator core to the next are not uniform.

The solution to this problem, in accordance with the invention, is to construct a rigid winding fixture in two pieces which, when assembled, form a toroidal winding around the core. A representative embodiment of such a fixture is shown in FIGS. 4, 5 and 6. FIG. 4 shows a first fixture piece 301 comprised of a non-conductive, non-magnetic bottom plate 302 on which two annuli—inner annulus 303 and outer annulus 304—are mounted. Inner annulus 303 is sized to fit within the inside diameter 23 of core 11, shown in FIG. 3, for example, and is fitted with a plurality of inner annulus axial conductors 305. The twelve inner conductors 305 illustrated in FIG. 4 each contain an associated reference label A' through L'. Outer annulus 304 is sized to fit around outside diameter 24 of core 11 shown in FIG. 3, for example, and is similarly fitted with a plurality of outer annulus axial conductors 306 equal in number to the number of inner conductors 305. Each of the outer conductors 306 corresponds to an inner conductor 305, and so is illustrated with an associated reference label A through L corresponding to the labels A' through L'. Although twelve inner and outer conductors 305 and 306 are illustrated, there may be any number of conductors allowed by the space available on the annuli. Annuli 303 and 304 are fabricated of non-conductive, non-magnetic materials, so that the only electric current on the annuli will be that in conductors 305 and 306.

FIG. 5 shows how electrical connections between inner and outer axial conductors 305 and 306 (FIG. 4) are made on bottom plate 302 via a plurality of bottom plate conductors 307 equal in number to one less than the number of inner and outer conductors 305 and 306, shown in FIG. 4. Each inner conductor 305 is connected to an outer conductor 306 that is displaced by one unit from the directly corresponding outer conductor (connection displacement). Thus, for example, a contact for inner conductor A' is connected to a contact for outer conductor B; a contact for inner conductor B' is connected to a contact for outer conductor C; etc. The first outer conductor contact A and the last inner conductor contact L' are not connected to one another, but are connected to testing leads 21 and 22 for external connection. This accounts for the number of bottom plate conductors

307 being one less than the number of inner and outer conductors 305 and 306. Bottom plate 302 is, of course, also non-conductive and non-magnetic. Test leads 21 and 22 are connected to contacts for inner conductor L' and outer conductor A.

FIG. 6 illustrates a second fixture piece 308 which comprises a top plate 309 designed to mate with the first fixture piece 301 (FIG. 4). Top plate 309 is shown from a bottom (upside down) view, and has points for contacting both sets of inner and outer axial conductors 305 and 306 (FIG. 4) and connecting them together via a plurality of top plate conductors 310 equal in number to the number of inner and outer conductors 305 and 306 (FIG. 4). Top plate 309 is also non-conductive and non-magnetic.

When second piece 308 is turned over and properly mated with first piece 301 (FIG. 4) each inner conductor 305 makes electrical contact with, and is connected directly, to its directly corresponding outer conductor 306. Thus, for example, inner conductor A' is connected to outer conductor A; inner conductor B' is connected to outer conductor B; etc. Consequently, when second piece 308 is joined with first piece 301 and stator core 11 (FIG. 2) is contained between the inner and outer annuli 303 and 304 (FIG. 4), a complete winding similar to that shown in FIG. 3 is formed about core 11. The connection displacement illustrated in FIG. 5 is ultimately responsible for achieving the necessary continuity of the winding. Test leads 21 and 22 may then be externally connected for stator quality testing, as shown in FIG. 3.

Figure 7:
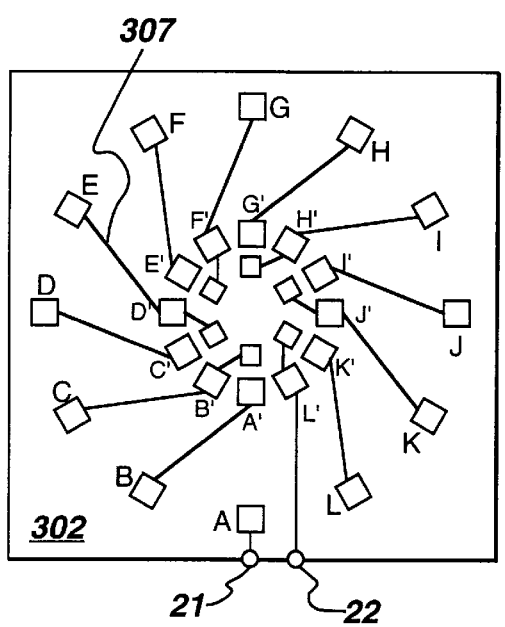
FIGS. 7 and 8, respectively, are top and bottom plan views of (illustrative) bottom and top plates for a multilayer fixture.
Figure 8:
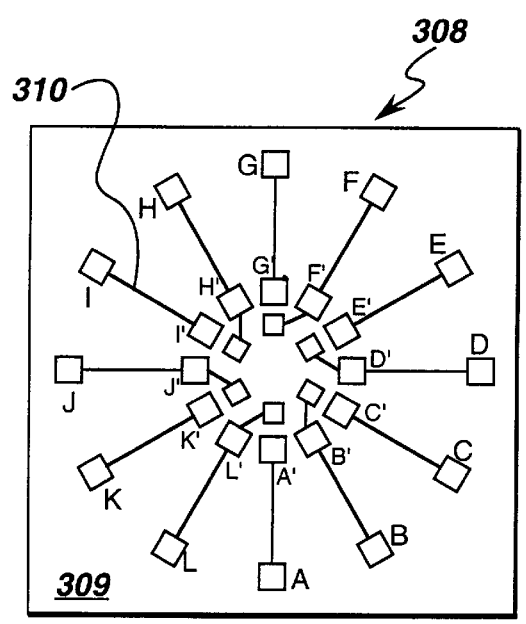

Although a single layer of turns is shown in FIG. 3, multiple layers may be implemented by adding axial conductors and contact points similarly connected on the top and bottom plates. Known methods of keying may be used to assure proper alignment of the elements. If the core is small enough, the axial leads and/or their connections may be plated in a manner similar to that for printed circuit boards and the connections may either be a simple metal-to-metal contact or actual circuit board type connectors. For large cores the leads need to be more substantial and comprise insulated wires glued or similarly attached to the annuli and fitted with connectors suitable for larger currents. The instant technique may be applied to cores ranging from resolvers where the typical dimensions may be in fractions of an inch, to locomotive traction motors where the typical dimensions may be in feet. FIGS. 7 and 8 depict use of this technique for large cores, illustrating a two-layer configuration which can readily be extended to multiple layers, as required. Where there is not enough physical space for all of the axial conductors (which would in reality be a problem primarily with inner annulus 303 (FIG. 4) due to its limited circumference), a second inner annulus can be introduced just inside the original inner annulus 303, with a second set of inner contact points as shown in FIGS. 7 and 8. Of course, a corresponding set of changes would have to be made on top and bottom plates 309 and 302, respectively. If layering were required on outer annulus 304 (FIG. 4), a second outer annulus just outside original outer annulus 304 would be introduced, and appropriate realignment of other contacts as well would have to be done. The net result would be a multilayer, rather than single layer, winding.

The fixture of this invention is easily placed around a stator core and easily removed. The fixture provides uniformity that cannot be achieved by hand winding. As the fixture does not directly contact the core, its use is non-destructive of stator quality. The invention has application to resolver testing, and generally, for controlling the quality of high efficiency motors.

Many variations can be made of this invention, all of which fall within the scope of this disclosure and its associated claims. For example, while axial conductors 305 and 306 (FIG. 4) are depicted as being substantially vertical, top plate conductors 310 (FIG. 6) are depicted as being substantially radial, and the connection displacement is achieved by the configuration of bottom plate connectors 307 as illustrated in FIG. 5, the overall winding effect of this invention can be achieved by a wide range of geometric variations to this configuration, all of which would be obvious in light of this disclosure. Thus, for example, axial conductors 305 and 306 can be mostly vertical, with a slight horizontal displacement, so that the connection displacement is achieved along the annuli rather than along the bottom plate. Or, the roles of the upper and lower plates can be reversed, with lower plate 302 providing a directly-corresponding inner-to-outer connection and upper plate 309 providing the connection displacement as well as leads 21 and 22 for external connection. Alternatively, the configuration of axial conductors 305 and 306 in combination with bottom and top plate conductors 307 and 310 can be such that all of the conductors are mildly graded to produce the necessary connection displacement. In short, there are a wide variety of configurations encompassed by the invention that can achieve the same net effect as the configurations illustrated herein.

While only certain preferred features of the invention have been illustrated and described, many modifications, changes and substitutions will occur to those skilled in the art. It is, therefore, to be understood that the appended claims are intended to cover all such modifications and changes as fall within the true spirit of the invention.

What is claimed is:

1. A fixture for evaluating production quality of a stator core (11), comprising:

an inner annulus having a plurality of inner axial conductors thereon;

an outer annulus having a plurality of outer axial conductors thereon;

a bottom plate having a plurality of bottom plate conductors (307) thereon; and a top plate having a plurality of top plate conductors (310) thereon; wherein the inner conductors and outer conductors are electrically connected to one another at lower ends thereof through said bottom plate conductors and at upper ends thereof through said top plate conductors, so as to form a complete, continuous electrical winding.

2. The fixture of claim 1, wherein:

said inner annulus, said outer annulus and said bottom plate together comprise a unitary first fixture piece to electrically connect the inner conductors and the outer conductors to one another at said lower ends thereof through said bottom plate conductors; and wherein said top plate comprises a unitary second fixture piece which is mated to said first fixture piece to electrically connect the inner conductors and the outer conductors to one another at said upper ends thereof through said top plate conductors, to complete said continuous electrical winding.

3. The fixture of claim 1, wherein:

said inner annulus, said outer annulus and said top plate together comprise a unitary first fixture piece to electrically connect the inner conductors and the outer conductors to one another at said upper ends thereof through said top plate conductors; and wherein said bottom plate comprises a unitary second fixture piece which is mated to said first fixture piece to electrically connect the inner conductors and the outer conductors to one another at said lower ends thereof through said bottom plate conductors, to complete said continuous electrical winding.

4. The fixture of claim 1, wherein:

quantities of said plurality of inner axial conductors, said plurality of outer axial conductors, and said plurality of top plate conductors are equal to one another, and are greater by one than a quantity of said plurality of bottom plate conductors; and wherein each one of said inner axial conductors corresponds with and is connected to one of said outer axial conductors at said upper ends thereof, via a further corresponding one of said top plate conductors; and further including first and second test leads situated upon said bottom plate;

a first one of said outer axial conductors being connected to said first test lead and a last one of said inner annulus axial conductors being connected to said second test lead;

each remaining one of said inner axial conductors being connected to a respective remaining one of said outer axial conductors that is displaced by one unit from its corresponding outer axial conductor at said lower ends thereof through a respective one of said bottom plate conductors.

5. The fixture of claim 1, wherein at least one of the inner annulus and the outer annulus comprises a plurality of annulus layers with a plurality of axial conductor layers, such that said complete, continuous electrical winding is a multilayer winding.

6. A method for testing a stator core, comprising the steps of:

containing said stator core between an inner annulus fitted within an inside diameter of the core and an outer annulus fitted around an outside diameter of the core, and further containing said stator core between a bottom plate proximate lower ends of the annuli and a top plate proximate upper ends of the annuli;

electrically connecting a plurality of inner axial conductors on said inner annulus and a plurality of outer axial conductors on said outer annulus to one another at lower ends of the axial conductors through bottom plate conductors on said bottom plate and at upper ends of the axial conductors through top plate conductors on said top plate, so as to form a complete, continuous electrical winding about said stator core; and connecting first and second ones of said conductors on said bottom plate to an external testing device.

7. The method of claim 6, wherein the step of containing the stator core between the inner annulus and outer annulus, and between the bottom plate and the top plate, comprises:

mating a unitary first fixture piece to a unitary second fixture piece;

said unitary first fixture piece comprising said inner annulus (303), said outer annulus and said bottom plate electrically connecting the inner axial conductors and the outer axial conductors to one another at said lower ends thereof through said bottom plate conductors, said unitary second fixture piece comprising said top plate electrically connecting the inner axial conductors and the outer axial conductors to one another at said upper ends thereof through said top plate conductors.

8. The method of claim 6, wherein the steps of containing the stator core between the inner annulus and the outer annulus, and between the bottom plate and the top plate, comprises:

mating a unitary first fixture piece to a unitary second fixture piece;

said unitary first fixture piece comprising said inner annulus, said outer annulus and said top plate electrically connecting the inner axial conductors and the outer axial conductors to one another at said upper ends thereof through said top plate conductors, said unitary second fixture piece comprising said bottom plate electrically connecting the inner axial conductors and the outer axial conductors to one another at said lower ends thereof through said bottom plate conductors.

9. The method of claim 6, wherein:

quantities of said plurality of inner axial conductors, said plurality of outer axial conductors, and said plurality of top plate conductors are equal to one another, and greater by one than a quantity of said plurality of bottom plate conductors; and further comprising the steps of:

connecting each one of said inner axial conductors to a corresponding one of said outer axial conductors at said upper ends thereof, via a further corresponding one of said top plate conductors;

connecting a first one of said outer axial conductors to said first one of said conductors on said bottom plate and a last one of said inner axial conductors to said second one of said conductors on said bottom plate; and connecting each remaining one of said inner axial conductors to a respective remaining one of said outer axial conductors that is displaced by one unit from its corresponding outer axial conductor at said lower ends thereof, through a respective remaining one of said bottom plate conductors.

10. The method of claim 6, wherein at least one of the inner annulus and the outer annulus comprises a plurality of annulus layers with a plurality of axial conductor layers, such that said complete, continuous electrical winding is a multilayer winding.

* * * * *